United States Patent [19]

Morelli

[11] Patent Number: 4,595,846
[45] Date of Patent: Jun. 17, 1986

[54] ELECTRONIC CIRCUIT FOR AMPLITUDE VARIATION AND LEVEL DISPLACEMENT OF A SIGNAL

[75] Inventor: Marco Morelli, Leghorn, Italy

[73] Assignee: SGS-ATES Componenti Elettronici S.p.A., Catania, Italy

[21] Appl. No.: 558,882

[22] Filed: Dec. 7, 1983

[30] Foreign Application Priority Data

Dec. 22, 1982 [IT] Italy .............................. 24905 A/82

[51] Int. Cl.$^4$ ............................................. G06G 7/12
[52] U.S. Cl. .................................... 307/490; 330/257; 330/288; 307/355
[58] Field of Search ............... 307/490, 355, 356, 263, 307/297, 264; 323/312, 313, 314, 315, 316; 330/257, 288

[56] References Cited

U.S. PATENT DOCUMENTS

| | | | |
|---|---|---|---|
| 3,956,645 | 5/1976 | Boer | 323/315 |
| 4,013,898 | 3/1977 | Makino | 307/355 |
| 4,032,839 | 6/1977 | Ahmed | 323/316 |
| 4,103,249 | 7/1978 | Burdick | 323/315 |
| 4,268,759 | 5/1981 | Gilbert | 307/490 |
| 4,399,399 | 8/1983 | Joseph | 323/316 |
| 4,513,178 | 4/1985 | Hing et al. | 323/316 |

Primary Examiner—John S. Heyman
Assistant Examiner—K. Ohralik
Attorney, Agent, or Firm—Cushman, Darby & Cushman

[57] ABSTRACT

A first circuit branch subjected to an input voltage and including a first resistance and a second circuit branch subjected to a reference voltage and including a second resistance are connected to a coupling circuit, which is responsive to the current circulating in the first branch to cause a current of the same value to circulate in the second branch. An output voltage taken at a point between said coupling circuit and said second resistance constitutes the modified signal.

3 Claims, 2 Drawing Figures

ELECTRONIC CIRCUIT FOR AMPLITUDE VARIATION AND LEVEL DISPLACEMENT OF A SIGNAL

The present invention relates to an electronic circuit for amplitude variation and level displacement of a signal.

In the electronic field it is usual to obtain from an opportunely generated and shaped signal the operation times and modes of several devices under control.

This is the case, for example, of the output signal of an electromagnetic distributor, which is used by a suitable integrated amplifier circuit for the control of the generation of the spark voltage for the spark plugs of an internal combustion engine.

The above mentioned signal has a waveform which periodically develops in part in the negative field and in part in the positive field, having an initial negative peak, a slowly rising trend in the zero crossing zone and a final positive peak immediately preceding a sudden return to zero. The rising trend zone about the zero crossing is used for the firing of the integrated circuit, while the final sudden return to zero is used to cause the generation of the spark voltage.

A use for such signal involves at least two problems linked to the signal shape and to the features of the integrated circuit which uses the signal. In fact, on one hand it would be necessary "to compress" in amplitude the signal so as to cause the positive peak also to be inside the operative "window" of the integrated circuit and on the other hand it would be necessary to carry out a level displacement of the rising trend zone used for the firing of the integrated circuit, so as to cause it to be inside the positive field in order to enable the integrated circuit to also use the part otherwise comprised in the negative field. Alternatively, it might be interesting "to widen" in amplitude the above mentioned signal so as to more widely explore and make use of the rising trend zone.

The object of the present invention is therefore to realize an electronic circuit, which allows the amplitude change ("compression" or "expansion") and the level displacement of a signal of any shape, particularly of a signal of the above mentioned kind, emitted by an electromagnetic distributor for the generation of the spark plug for an internal combustion engine.

According to the invention such an object has been achieved by means of an electronic circuit characterized in that it comprises a first circuit branch subjected to an input voltage and including a first resistance, a second circuit branch subjected to a reference voltage and including a second resistance, and a coupling circuit for said circuit branches, which is responsive to the current circulating in the first branch to cause a current of the same value to circulate in the second branch, a voltage output being provided between said coupling circuit and said second resistance for obtaining a modified signal having an amplitude changed as a function of the ratio of said resistances and a level changed as a function of a constant depending on said ratio, on said reference voltage and on the features of said coupling circuit.

An embodiment of the electronic circuit according to the invention is illustrated for better clarity in the enclosed drawings, in which.

Figure 1:
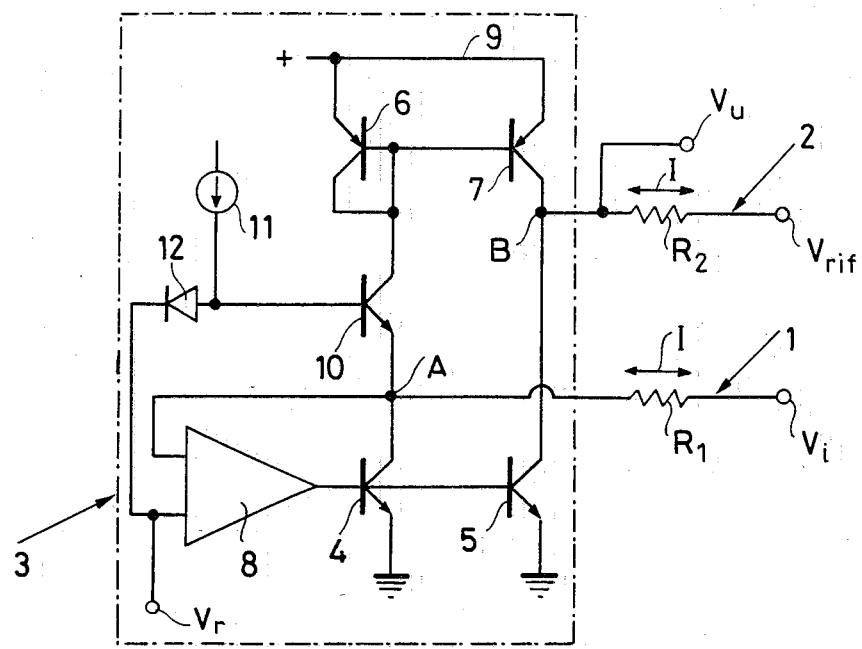
FIG. 1 shows the detailed diagram of the above mentioned circuit according to the invention.

With reference to FIG. 1, there is illustrated a circuit according to the invention, which substantially comprises two circuit branches 1 and 2. Circuit branch 1 is subjected to an input voltage $V_i$ and includes a resistance $R_1$, and circuit branch 2 is subjected to a reference voltage $V_{rif}$ and includes a resistance $R_2$.

The two circuit branches 1 and 2 are connected to each other by a coupling circuit 3, which includes two pairs of equal transistors 4–5 and 6–7 with interconnected bases and has the collector of the transistor (NPN) 4 connected to the circuit branch 1 at a node A and the collector of the transistor (NPN) 5 connected to the circuit branch 2 at a node B. The interconnected bases of the transistors 4 and 5, both with a ground-connected emitter, are connected to the output of an operational amplifier 8, which has an input fed with a reference voltage $V_r$ (for example, 200 mV) and another input directly connected to the circuit node A, so as to form an amplifier with unitary reaction, which has at the node A a voltage equal to the reference voltage $V_r$. The transistors (PNP) 6 and 7 in turn have their emitters connected together to a positive supply 9 (for example, 7 V) and their collectors are connected to the collectors of the transistors 4 and 5, in the case of the transistor 6 through a transistor (NPN) 10 driven by a current generator 11. The collector and the base of the transistor 6 are connected to each other. A diode 12 is interposed between the base of transistor 10 and the reference terminal $V_r$.

Between the resistance $R_2$ of the circuit branch 2 and the coupling circuit 3 there is finally provided a voltage output $V_u$ from which the desirable modified signal can be obtained, as it will be better explained later on.

Figure 2:
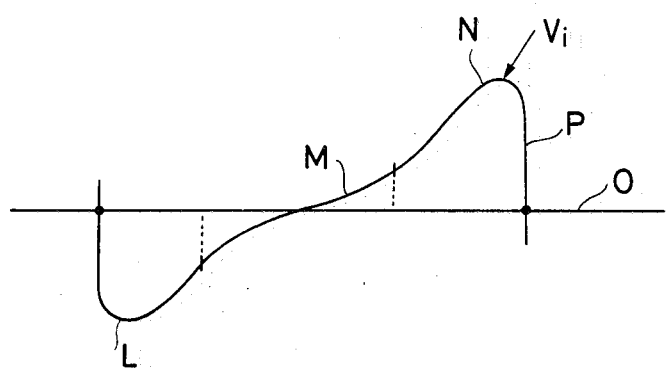
FIG. 2 shows the waveform of a signal, generated by an electromagnetic distributor, for which the use of the circuit according to the invention is particularly indicated by using the signal as the input to the circuit.

A circuit such as that shown in FIG. 1 is particularly indicated to carry out the amplitude change (compression or expansion) and the level displacement of a signal such as that of FIG. 2, which is the typical signal emitted by an electromagnetic distributor for an internal combustion engine. The signal comprises a succession of cycles with waveform in part in the negative field and in part in the positive one (the line O dividing the two fields). More precisely, the above mentioned signal (for simplicity indicated with $V_i$ as the input voltage of the circuit of FIG. 1) comprises an initial negative peak L, a slowly rising trend zone M bridging of the crossing point of the zero line and a final positive peak N immediately preceding a sudden return to zero P.

For the already said reasons it would be necessary "to compress" or "to expand" this signal as well as to change the level thereof so as to cause the whole rising advancement zone M to be inside the positive field, that is, above the zero line.

This is possible by applying said signal as input voltage $V_i$ to the circuit branch 1 of the circuit of FIG. 1 after having opportunely chosen the reference voltages $V_{rif}$ and $V_r$ and the value of the resistance $R_1$ and $R_2$.

Looking at the above mentioned circuit, in fact, it is possible to note that, since the voltage at the node A is equal to $V_r$, a current I passes through the circuit branch 1 whose value is $$I = (V_i - V_r)/R_1$$

and whose signal changes with the sign of the input voltage $V_i$. If the sign is such that the current in the branch 1 is directed towards the node A, the above mentioned current creates a current circulation through the transistors 4 and 5 of the coupling circuit 3 and consequently a current of the same sign (that is directed towards the node B) in the circuit branch 2. On the contrary, if the current sign in the branch 1 is opposite, that is the current goes out of the node A, the transistors 6 and 7, with the aid of the transistor 10, are conducting and create a current of the same sign (that is going out of the node B) in the circuit branch.

In both cases, as the two transistors 4 and 5 are equal and with interconnected bases and the same is true for the transistors 6 and 7, that is said transistors are in a "mirror" configuration, the currents which pass through the transistors 4 and 5 (with I directed to the node A) are equal to each other, as well as are the currents which pass through the transistors 6 and 7 (with I directed in opposite sense). This means also that the currents which pass through the resistances $R_1$ and $R_2$ are equal to each other (and are of the same sign), with each current equal to the above mentioned value I.

It results that an output voltage $V_u$ is available $$V_u = V_{rif} - R_2 I$$

that, seen the value of I, becomes:

$$V_u = V_{rif} - \frac{R_2}{R_1}(V_i - V_r) = V_{rif} - \frac{R_2}{R_1} V_i + \frac{R_2}{R_1} V_r = K - \frac{R_2}{R_1} V_i \text{ being } K = V_{rif} + \frac{R_2}{R_1} V_r$$

It follows that the circuit of FIG. 1 transforms the input signal $V_i$ into an output signal $V_u$, whose amplitude is changed as a function of the ratio of the resistances $R_2$ and $R_1$, i.e. it is "compressed" if $R_1 > R_2$ and "expanded" if $R_1 < R_2$, and the average level (corresponding to the central point of the rising trend zone M of the signal $V_i$) is raised as a function of the value of the constant K, that is as a function of the above mentioned ratio of the resistances $R_2$ and $R_1$, of the value of the reference voltage $V_{rif}$ and of the value of the voltage $V_r$ at the node A of the coupling circuit 3, in its turn depending on the chosen value of the reference voltage $V_r$ applied to the operational amplifier 8, as well as on the structural features of the same coupling circuit.

Practically, once the values of $V_{rif}$ and $V_r$ are fixed, the amplitude of the input signal can be changed by simply acting on $R_1$ and $R_2$ or, if desired, only on $R_1$ with $R_2$ constant (or vice-versa). Such a change of the ratio $R_2/R_1$ cannot influence the signal level, if $V_{rif}$ has been chosen so as to be predominant with respect to $V_r$.

In order to obtain the desired results it will however be necessary to take care that the resistances $R_1$ and $R_2$ are subjected to the same thermic conditions and the same is true for the coupled transistors 4–5 and 6–7. This can be obtained by opportunely approaching the resistances $R_1$ and $R_2$ and inserting the transistors 3, 4, 5 and 6 in a single integrated block together with the operational amplifier 8, the transistor 10, the current generator 11 and the generators of the reference voltages $V_{rif}$ and $V_r$.

In addition, as the variable component of $V_u$, that is $R_2/R_1 V_i$, is preceded by the sign "—", it is necessary to carry out a signal inversion before applying it to the integrated circuit.

It is finally to be noted that the transistor 10, with relative current generator 11, has the function to supply the current absorbed by the circuit branch 1 when $V_i < V_r$ and at the same time to limit the current in the coupling circuit 3 during the rest periods. The transistor 10 also has the function to assure a rest current, which is controlled by the diode 12.

I claim:

1. An electronic circuit for amplitude variation and level displacement of a signal, comprising:
    a first circuit branch including a first resistance and supplied with an input voltage signal;
    a second circuit branch including a second resistance and provided with a reference voltage; and
    a circuit coupling interposed between said circuit branches to cause them to conduct respective currents of the same value, said coupling circuit comprising:
    first and second pairs of transistors, the transistors of each pair being equal to one another, with the bases of the two transistors of the first pair being interconnected and the bases of the second pair of transistors being interconnected, and with the transistors of the first pair serially connected with respective transistors of the second pair;
    a first circuit node between a first transistor of the first pair and a first transistor of the second pair being connected to said first circuit branch; and
    a second circuit node between the second transistor of the first pair and the second transistor of the second pair being connected to said second circuit branch, so that the first and second pairs of transistors are alternatively conducting according to the sign of the input voltage signal and the transistors of each pair are passed through by respective currents equal to each other and to those circulating in said current branches, an output voltage signal being made available at a circuit output connected to said second circuit node of the coupling circuit.

2. An electronic circuit according to claim 1, wherein said coupling circuit includes an operational amplifier having a first input provided with a further reference voltage and a second input connected to said first circuit node.

3. An electric circuit according to claim 1, wherein said coupling circuit includes a further transistor interposed between said first circuit node and the first transistor of the second pair, said further transistor being driven by a current generator.

* * * * *